United States Patent
Jung et al.

(10) Patent No.: US 9,431,437 B2
(45) Date of Patent: Aug. 30, 2016

(54) DISPLAY PANEL AND METHOD OF MANUFACTURING THE SAME

(71) Applicant: Samsung Display Co., Ltd., Yongin, Gyeonggi-Do (KR)

(72) Inventors: Yang-Ho Jung, Seoul (KR); SeungBo Shim, Asan-si (KR); Jinho Ju, Seoul (KR); Junhong Park, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 181 days.

(21) Appl. No.: 14/188,959

(22) Filed: Feb. 25, 2014

(65) Prior Publication Data

US 2015/0060857 A1 Mar. 5, 2015

(30) Foreign Application Priority Data

Aug. 29, 2013 (KR) .................. 10-2013-0103454

(51) Int. Cl.
*H01L 21/00* (2006.01)
*H01L 27/12* (2006.01)

(52) U.S. Cl.
CPC .................................. *H01L 27/1288* (2013.01)

(58) Field of Classification Search
None
See application file for complete search history.

(56) References Cited

U.S. PATENT DOCUMENTS

| | | | |
|---|---|---|---|
| 8,071,974 B2 | 12/2011 | Seo et al. | |
| 2009/0302321 A1 | 12/2009 | Park et al. | |
| 2010/0149476 A1 | 6/2010 | Kim et al. | |
| 2012/0126233 A1* | 5/2012 | Chang | H01L 27/124 257/59 |
| 2012/0138934 A1 | 6/2012 | Kang et al. | |
| 2012/0248443 A1* | 10/2012 | Katsui | G02F 1/1368 257/57 |

FOREIGN PATENT DOCUMENTS

| | | |
|---|---|---|
| KR | 1020000003114 A | 1/2000 |
| KR | 1020010045446 A | 6/2001 |
| KR | 1020010046653 A | 6/2001 |
| KR | 1020040095761 A | 11/2004 |
| KR | 1020050058594 A | 6/2005 |
| KR | 1020070039180 A | 4/2007 |
| KR | 1020120041891 A | 5/2012 |

* cited by examiner

*Primary Examiner* — Minh-Loan Tran
*Assistant Examiner* — Shaka White
(74) *Attorney, Agent, or Firm* — Cantor Colburn LLP

(57) ABSTRACT

A display panel includes a gate electrode and a gate line on a substrate, a gate insulating layer and an active layer sequentially on the gate electrode and the gate line, a planarization layer which is on the substrate and compensates for a step difference between the substrate, and the gate electrode and the gate line, respectively, source and drain electrodes on the active layer overlapping the gate electrode and spaced apart from each other, a data line on the active layer and crossing the gate line, a protective layer which covers the planarization layer, the source and drain electrodes, and the data line, a contact hole defined in the planarization layer and partially exposing the drain electrode, and a pixel electrode on the protective layer and electrically connected to the drain electrode through the contact hole.

18 Claims, 29 Drawing Sheets

DISPLAY PANEL AND METHOD OF MANUFACTURING THE SAME

This application claims priority to Korean Patent Application No. 10-2013-0103454, filed on Aug. 29, 2013, and all the benefits accruing therefrom under 35 U.S.C. §119, the contents of which are hereby incorporated by reference in its entirety.

BACKGROUND

1. Field

The invention relates to a display panel and a method of manufacturing the same. More particularly, the invention relates to a display panel having a low resistance line structure and a method of manufacturing the display panel.

2. Description of the Related Art

In general, a liquid crystal display device includes a thin film transistor substrate, a color filter substrate, and a liquid crystal layer interposed between the thin film transistor substrate and the color filter substrate.

The thin film transistor substrate includes pixels to display an image. Each pixel includes a thin film transistor and a pixel electrode. The thin film transistor receives gate and data signals provided respectively through gate and data lines, and applies the data signal to the pixel electrode during a turned-on period of the gate signal.

SUMMARY

One or more exemplary embodiment of the invention provides a display panel capable of widening a range of selecting a material used for a planarization layer in a low resistance line structure, and lowering manufacturing process difficulty thereof.

One or more exemplary embodiment of the invention provides a method of manufacturing the display panel.

An exemplary embodiment of the invention provides a method of manufacturing a display panel including sequentially stacking a first metal layer, a first insulating layer, an amorphous silicon layer, an n+ amorphous silicon layer and a first photoresist layer on a substrate including a transistor area and a line area, patterning the first photoresist layer using a first mask including a halftone pattern in the transistor area and the line area to form a first photoresist pattern, substantially simultaneously patterning the stacked amorphous silicon, first insulating and first metal layers using the first photoresist pattern as a mask to form an active layer, a gate insulating layer and a gate electrode extended from a gate line, respectively, forming a planarization organic layer including an organic material on the active layer and the substrate after the active layer is formed, removing the planarization organic layer overlapping the active layer to form a planarization layer, forming a second metal layer on the planarization layer and the active layer, patterning the second metal layer using a second mask to form a source electrode, a drain electrode and a data line, forming a protective layer on the planarization layer to cover the source electrode, the drain electrode, and the data line, patterning the protective layer using a third mask to form a contact hole through which the drain electrode is exposed, forming a transparent electrode layer on the protective layer, and patterning the transparent electrode layer using a fourth mask to form a pixel electrode electrically connected to the drain electrode through the contact hole.

An exemplary embodiment of the invention provides a display panel including a gate electrode and a gate line, on a substrate, a gate insulating layer and an active layer sequentially on the gate electrode and the gate line, a planarization layer which is on the substrate and compensates a step difference between the substrate, and the gate electrode and the gate line, respectively, source and drain electrodes on the active layer overlapping the gate electrode to be spaced apart from each other, a data line on the active layer and crossing the gate line, a protective layer which covers the planarization layer, the source and drain electrodes, and the data line, a contact hole defined in the protective layer and partially exposing the drain electrode, and a pixel electrode on the protective layer and electrically connected to the drain electrode through the contact hole.

According to one or more exemplary embodiment of the invention, when the thickness of the gate electrode and the gate line is increased to reduce the electrical line resistance thereof, the planarization layer disposed thereon prevents the step difference from being generated. In addition, in a method of manufacturing a thin film transistor of a display panel, since the planarization layer is formed after a process of forming the active layer is performed at a high temperature, the planarization layer may not include an organic material with high temperature resistance. Therefore, a range of selecting a material used for the planarization layer may be widened.

In addition, the thin film transistor substrate is manufactured using four masks and the portion to which the halftone pattern is applied is not a fine pattern, e.g., a channel area of the transistor, and thus the manufacturing process difficulty may be lowered.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION

Figure 1:
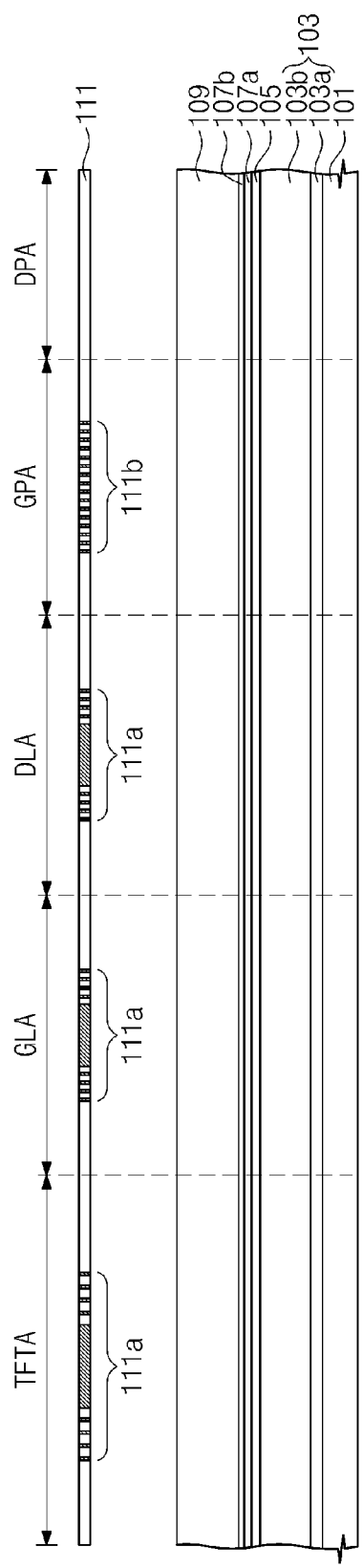
FIGS. 1 to 17 are cross-sectional views showing an exemplary embodiment of a method of manufacturing a display panel according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, "connected" may include in physical and/or electrical connection. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

As a liquid crystal display device increases in size and resolution, signal lines, e.g., gate and data lines, are formed to have a low electrical resistance line structure in order to reduce a line electrical resistance in the signal lines. As the low line electrical resistance structure, a method of increasing a thickness of the gate line has been suggested. However, when the gate line increases in thickness, a step difference is generated in the thin film transistor substrate. Therefore, there remains a need for an improved low line electrical resistance structure and a display panel including the same.

Hereinafter, the invention will be explained in detail with reference to the accompanying drawings.

FIGS. 1 to 17 are cross-sectional views showing an exemplary embodiment of a method of manufacturing a display panel according to the invention.

Referring to FIG. 1, a first metal material layer 103 is formed on a substrate 101. In detail, the first metal material layer 103 includes a first lower metal layer 103a formed of titanium (Ti) and a first upper metal layer 103b formed of copper (Cu), which are sequentially stacked on the substrate 101 such as by a deposition process. Besides the above-mentioned materials, the first metal material layer 103 may include various materials, such as aluminum (Al), chromium (Cr), etc.

As an exemplary embodiment, the first metal material layer 103 has a total cross-sectional thickness of about 1 micrometer to about 3 micrometers to reduce a line resistance of a signal line formed therefrom, such as a gate line.

A first insulating layer 105, an amorphous silicon layer 107a, an n+ amorphous silicon layer 107b and a first photoresist layer 109 are sequentially stacked on the first upper metal layer 103b of the first metal material layer 103.

The first insulating layer 105 includes silicon nitride (SiNx) or silicon oxide (SiOx) and has a cross-sectional thickness of about 1000 angstroms. The amorphous silicon layer 107a and the n+ amorphous silicon layer 107b are deposited on the first insulating layer 105 such as by a chemical vapor deposition ("CVD") process.

The first photoresist layer 109 is formed on the n+ amorphous silicon layer 107b and a first mask 111 is disposed on the first photoresist layer 109. The first mask 111 has a halftone pattern 111a in a transistor area TFTA and first and second line areas GLA and DLA, and a slit pattern 111b in a first pad area GPA.

The first photoresist layer 109 is exposed and developed when the first mask 111 is disposed on the first photoresist layer 109, and then the exposed first photoresist layer 109 is removed. As a result, a first photoresist pattern 110 is formed on the n+ amorphous silicon layer 107b as shown in FIG. 2.

Figure 2:
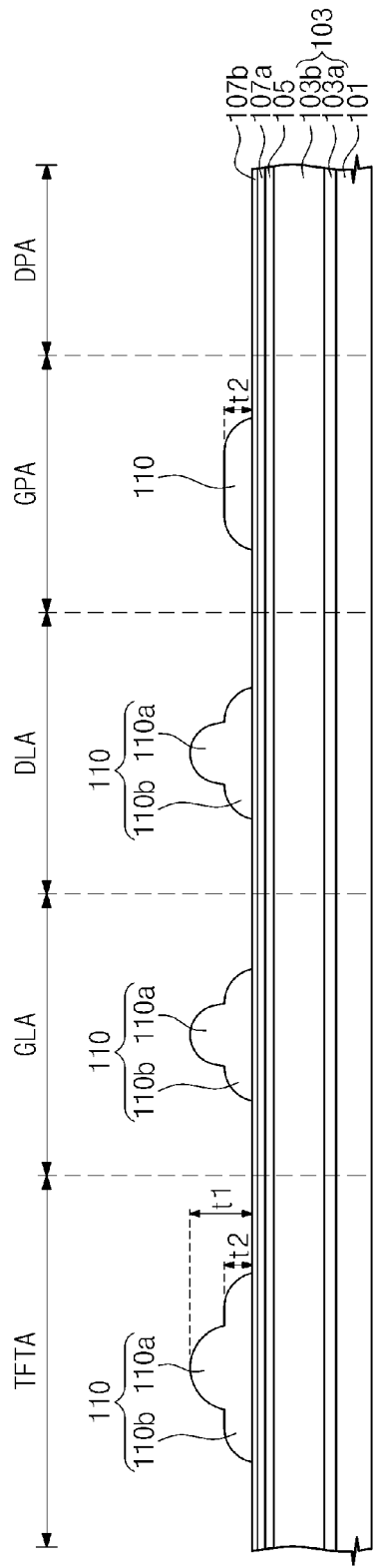

Referring to FIG. 2, the first photoresist pattern 110 includes a first part 110a corresponding to a center portion of the transistor area TFTA and the first and second line areas GLA and DLA, and a second part 110b formed along an end portion of the transistor area TFTA and the first and second line areas GLA and DLA.

The first part 110a of the first photoresist pattern 110 has a first cross-sectional thickness t1 and the second part 110b of the first photoresist pattern 110 has a second cross-sectional thickness t2 smaller than the first thickness t1.

The first photoresist pattern 110 has the second thickness t2 in the first pad area GPA and is completely excluded in the second pad area DPA where the first photoresist layer 109 has been removed.

Figure 3:
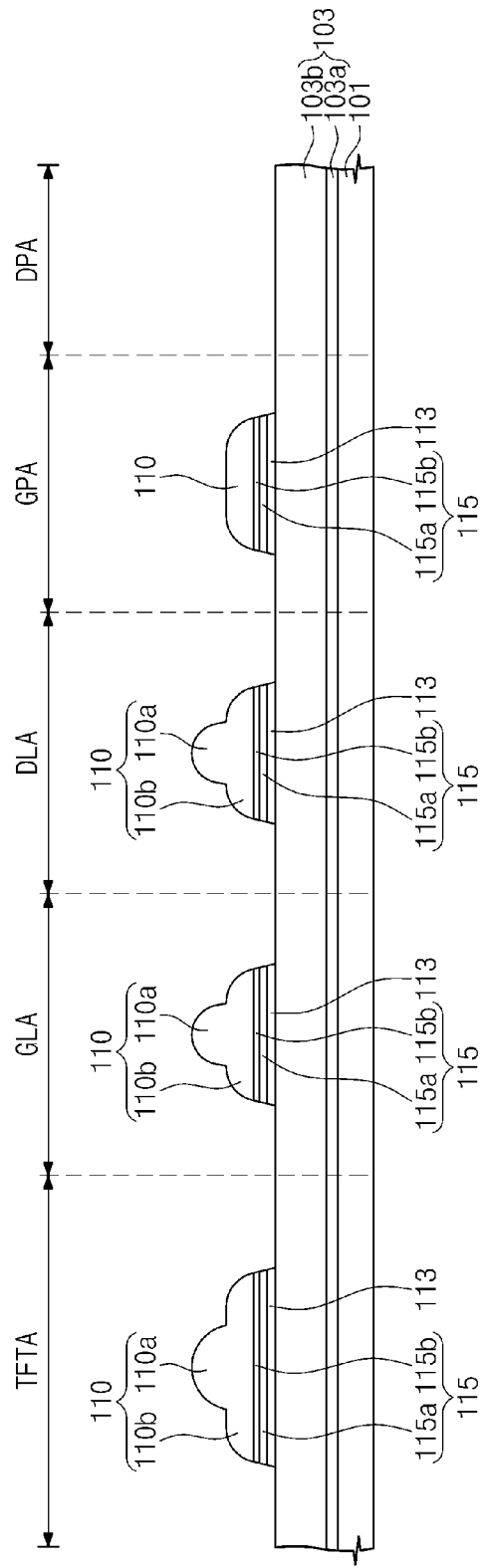

Then, the first insulating layer 105, the amorphous silicon layer 107a, and the n+ amorphous silicon layer 107b are dry-etched using the first photoresist pattern 110 as a mask, and thus the first insulating layer 105, the amorphous silicon layer 107a, and the n+ amorphous silicon layer 107b are removed except for the area in which the first photoresist pattern 110 is formed. Accordingly, as shown in FIG. 3, a gate insulating layer 113 and an active layer 115 are formed on the first metal material layer 103. The active layer 115 includes a semiconductor layer 115a and an ohmic contact layer 115b.

Here, a condition of the dry etching process may be controlled such that an edge of the gate insulating layer 113 and the active layer 115 has a forward taper shape.

Figure 4:
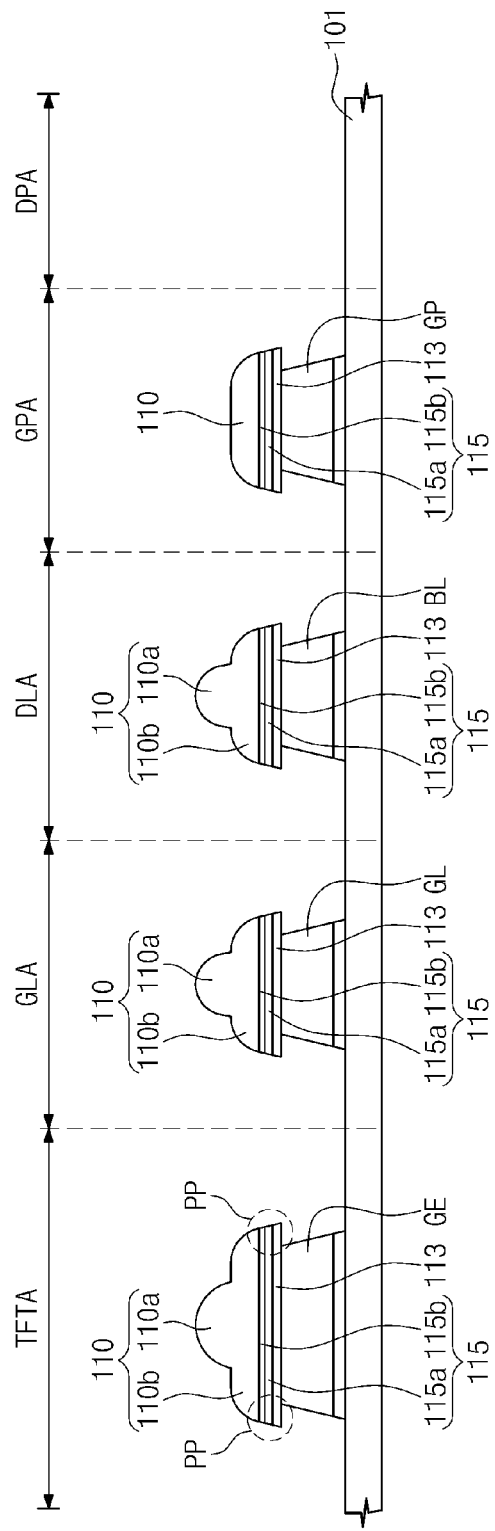

After that, as shown in FIG. 4, the first lower metal layer 103a and the first upper metal layer 103b of the first metal material layer 103 are wet-etched to form a gate electrode GE in the transistor area TFTA, a gate line GL in the first line area GLA, and a light blocking line BL in the second line area DLA. In addition, a gate pad GP is formed in the first pad area GPA. The gate electrode GE, the gate line GL, the light blocking line BL and the gate pad GP are in a same layer. While the lead line points to only one layer in the structure, the gate electrode GE, the gate line GL, the light blocking line BL and the gate pad GP include both the first lower metal layer 103a and the first upper metal layer 103b of the first metal material layer 103.

When the first metal material layer 103 is wet-etched, an under-cut occurs, in which an upper surface of the gate electrode GE, the gate line GL, the light blocking line BL and the gate pad GP has a size (e.g., width parallel to the substrate 101) smaller than that of a lower surface of the overlying gate insulating layer 113. Due to the under-cut, an outer edge of the gate insulating layer 113 and the active layer 115 is protruded further outward than an outer edge of each of the gate electrode GE, the gate line GL, the light blocking line BL and the gate pad GP. Here, the portion of the gate insulating layer 113 and the active layer 115, which is protruded further outward than the edge of each of the gate electrode GE, the gate line GL, the light blocking line BL and the gate pad GP, is called a protrusion portion PP.

Figure 5:
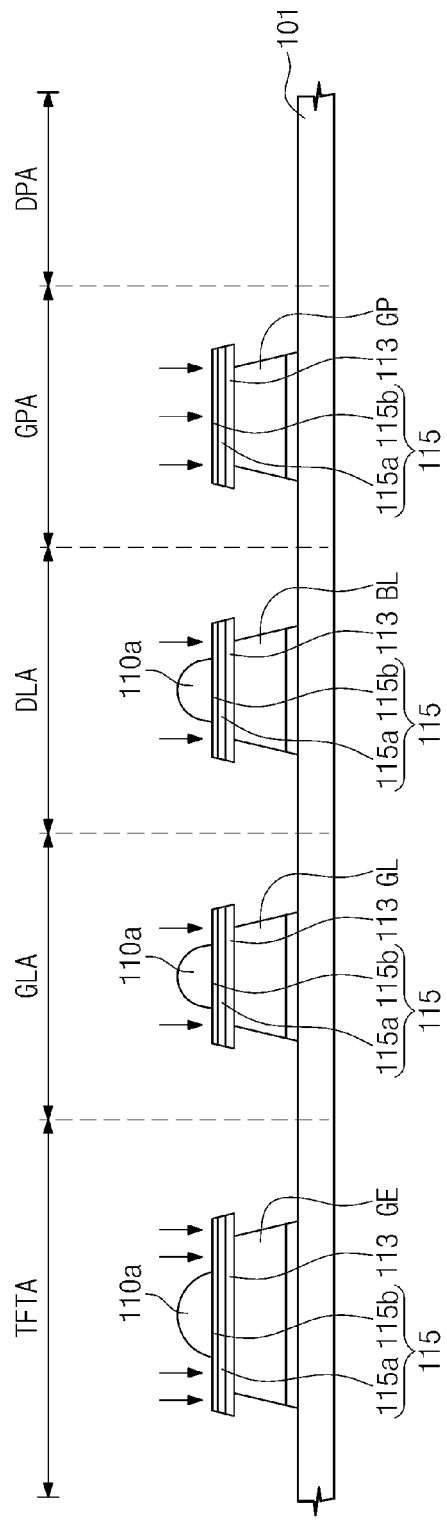

Then, as shown in FIG. 5, the second part 110b of the first photoresist pattern 110 is removed by an etchback process. Therefore, only the first part 110a of the first photoresist pattern 110 remains in the transistor area TFTA and the first and second areas GLA and DLA, and the first photoresist pattern 110 is completely removed in the first pad area GPA.

Figure 6:
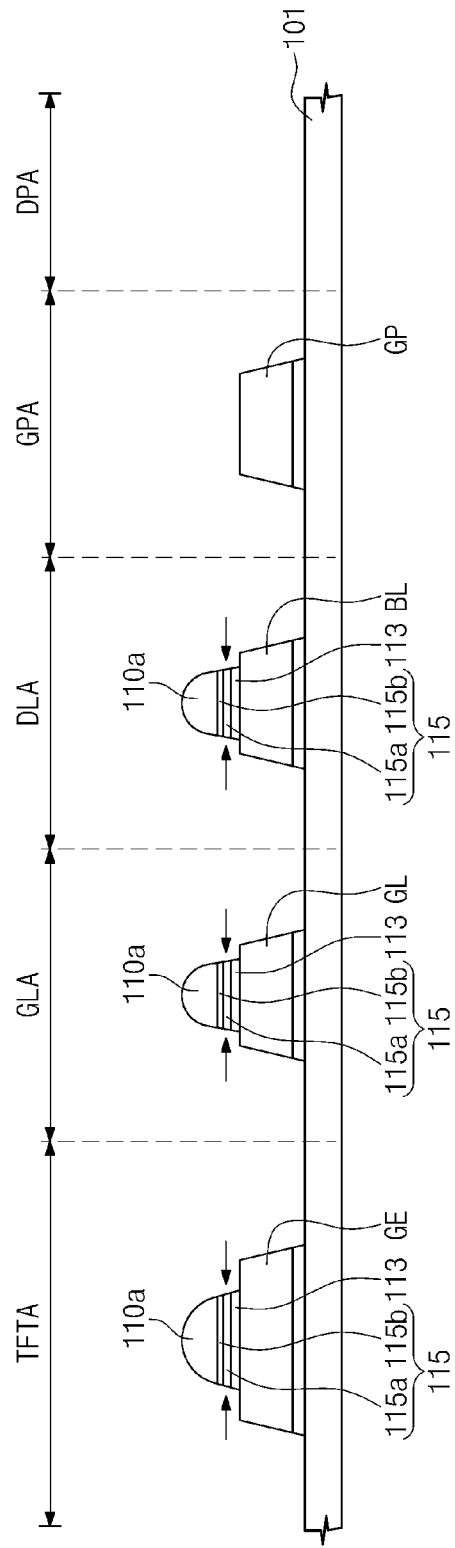

When the active layer 115 and the gate insulating layer 113 are dry-etched using the first part 110a as a mask, the protrusion portion PP is removed as shown in FIG. 6. The active layer 115 and the gate insulating layer 113 are completely removed on the gate pad GP in the first pad area GPA.

As the first metal material layer 103 increases in thickness, the under-cut is intensified, and thus the protrusion portion PP increases in width. Thus, a width of the second part 110b is determined depending on the thickness of the first metal material layer 103, so that the halftone pattern 111a of the first mask 111 may be controlled.

Figure 7:
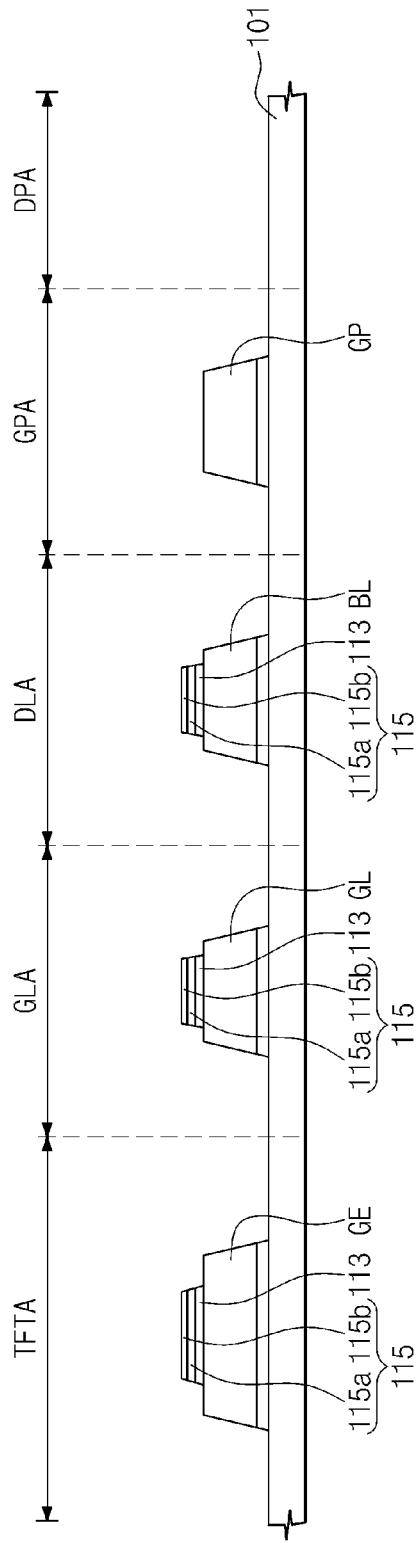

Referring to FIG. 7, the first part 110a of the first photoresist pattern 110 is removed by a strip process.

Figure 8:
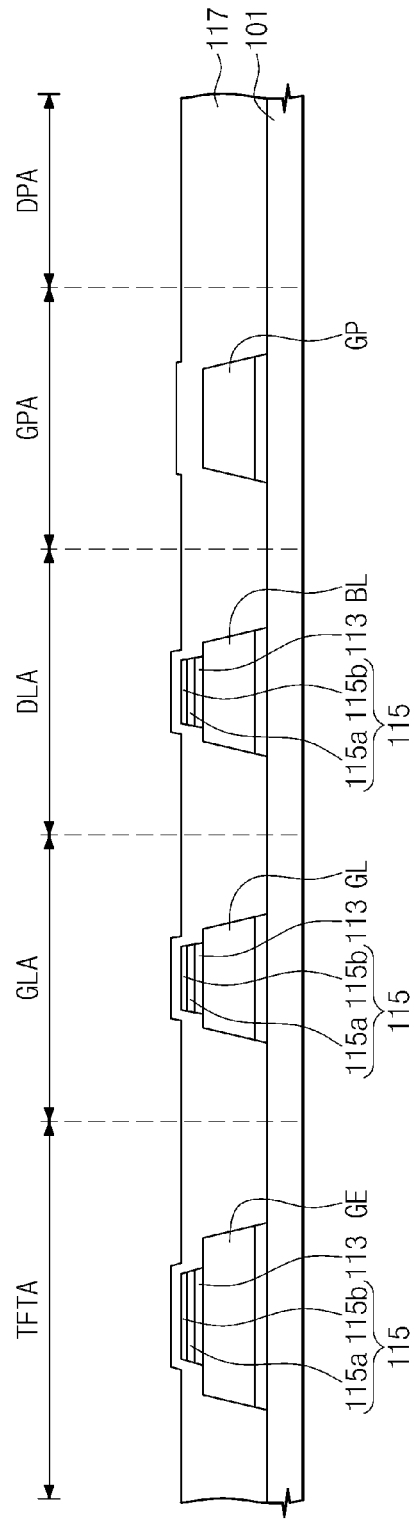

Referring to FIG. 8, a planarization organic layer 117 is formed on the active layer 115 and the substrate 101. The planarization layer 117 includes an organic material. In the illustrated exemplary embodiment, the planarization layer 117 may have a negative photosensitivity, but the invention is not limited thereto.

Figure 9:
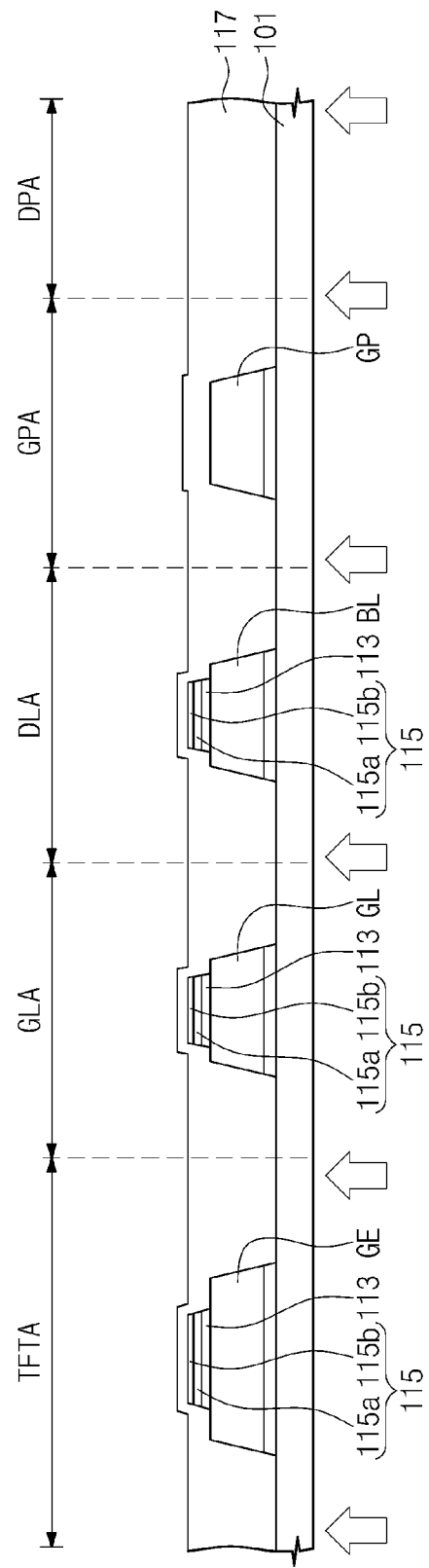

As shown in FIG. 9, when a rear surface exposing process is performed on the planarization organic layer 117 from a rear of the substrate 101 as indicated by the open shape arrows, and a development process is performed, portions of the planarization organic layer 117, which are not exposed, may be removed. In particular, the gate electrode GE, the gate line GL, the light blocking line BL and the gate pad GP do not transmit the light during the rear surface exposing process since the gate electrode GE, the gate line GL, the light blocking line BL and the gate pad GP are formed of a metal material. Therefore, the planarization organic layer 117 on the gate electrode GE, the gate line GL, the light blocking line BL and the gate pad GP may be completely removed.

Thus, the planarization organic layer 117 may be removed in the areas, in which the gate electrode GE, the gate line GL, the light blocking line BL and the gate pad GP are formed, without using any mask.

Figure 10:
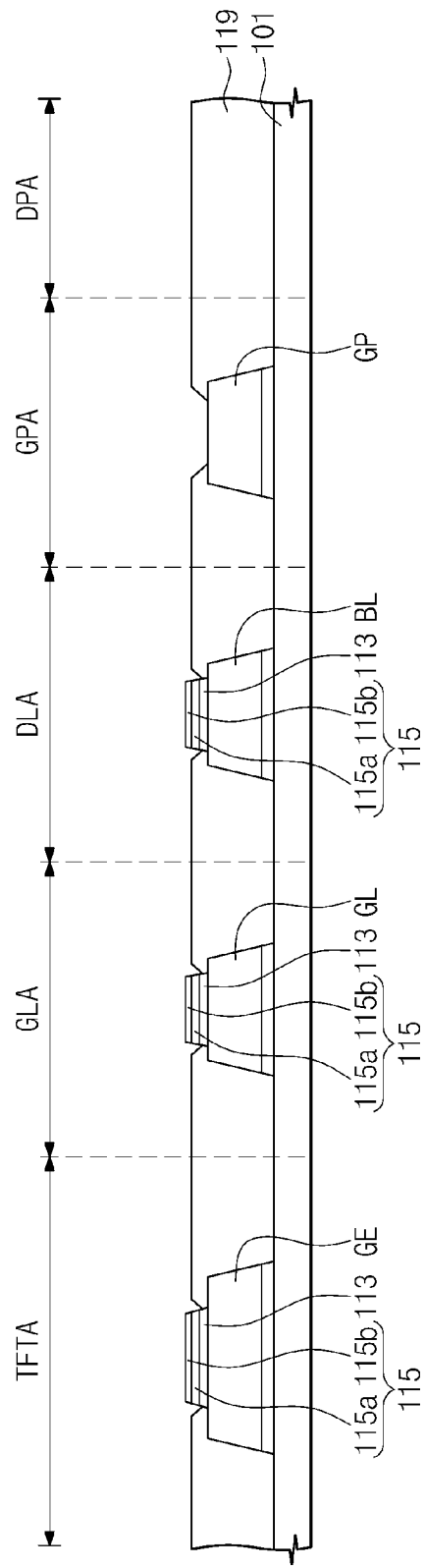

When a curing process is performed, a planarization layer 119 is formed as shown in FIG. 10. In detail, the planarization layer 119 exposes the upper surface of the active layer 115 in the transistor area TFTA and the first and second line areas GLA and DLA, and exposes the upper surface of the gate pad GP in the first pad area GPA.

Figure 11:
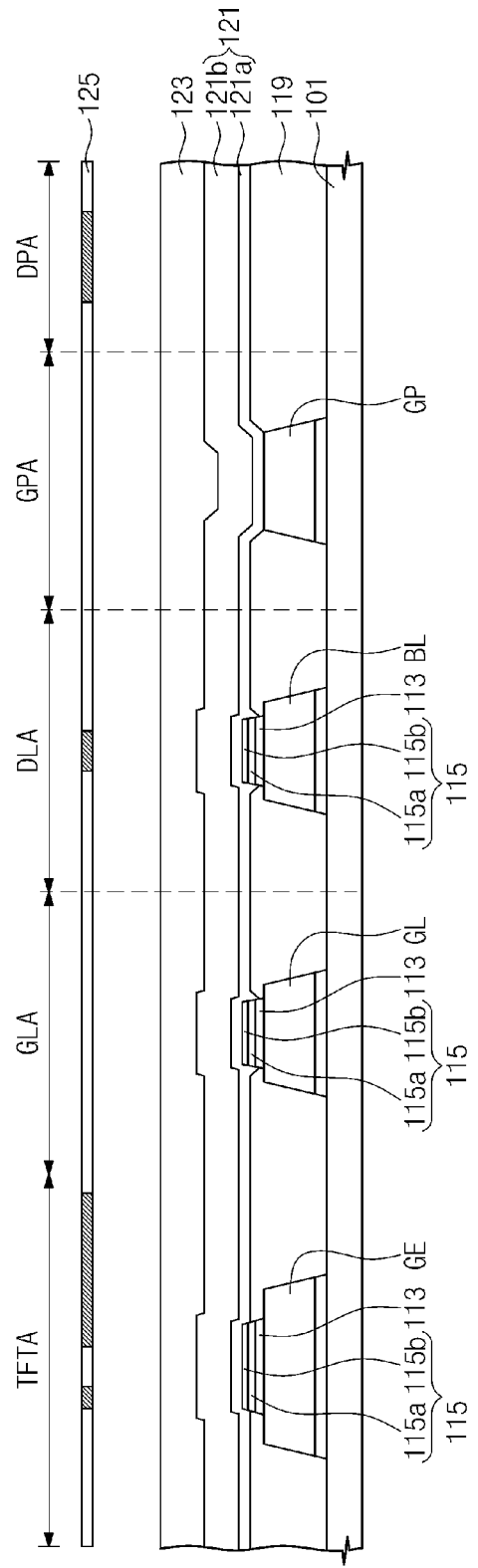

Referring to FIG. 11, a second metal material layer 121 is formed on the planarization layer 119, the exposed active layer 115 and the exposed gate pad GP. The second metal material layer 121 includes a second lower metal layer 121a formed of titanium (Ti) and a second upper metal layer 121b formed of copper (Cu), which are sequentially deposited such as by a deposition process. Besides the above-mentioned materials, the second metal material layer 121 may include various materials, such as aluminum (Al), chromium (Cr), etc.

In addition, a second photoresist layer 123 is formed on the second metal material layer 121.

Figure 12:
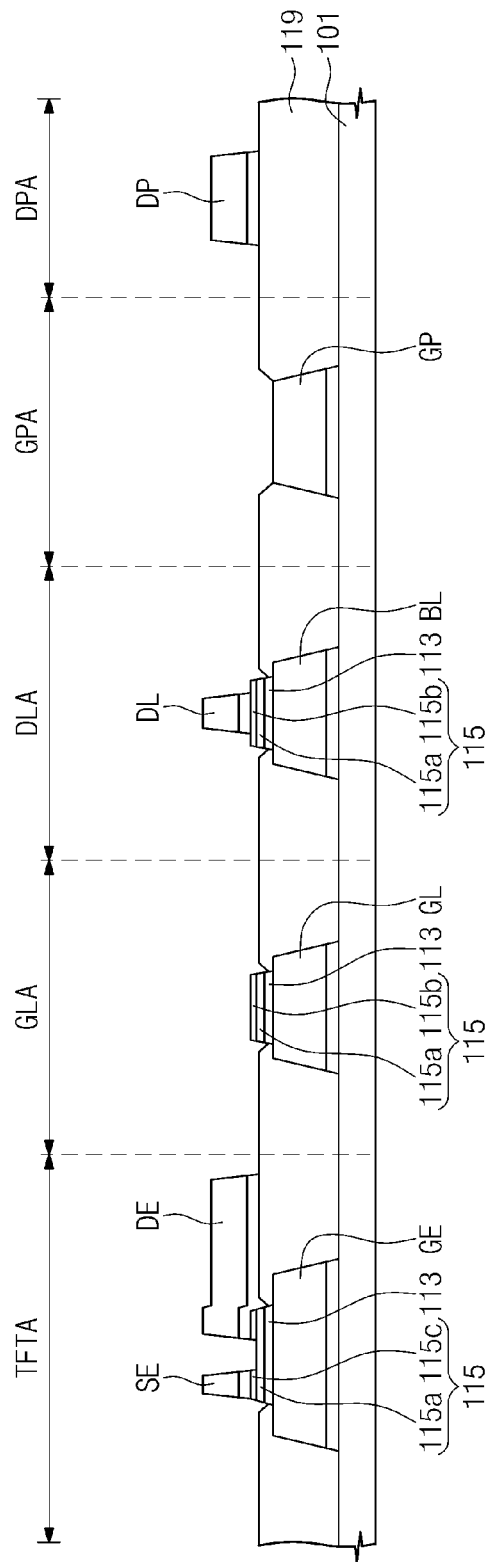

Then, the second photoresist layer 123 is exposed and developed using a second mask 125 to form a second photoresist pattern (not shown). When the second lower metal layer 121a and the second upper metal layer 121b of the second metal material layer 121 are etched using the second photoresist pattern as a mask, a source electrode SE, a drain electrode DE, a data line DL and a data pad DP are formed as shown in FIG. 12. The source electrode SE, the drain electrode DE, the data line DL and the data pad DP are in a same layer. While the lead line points to only one layer in the structure, the source electrode SE, the drain electrode DE, the data line DL and the data pad DP include both the second lower metal layer 121a and the second upper metal layer 121b of the second metal material layer 121.

In detail, the source electrode SE and the drain electrode DE are formed in the transistor area TFTA to be spaced apart from each other by a predetermined distance in a width direction. The ohmic contact layer 115b is removed in an area between the source electrode SE and the drain electrode DE, and thus a channel layer 115c is formed.

In addition, the data line DL is formed on the active layer 115 in the second line area DLA and the data pad DP is formed on the planarization layer 119 in the second pad area DPA.

As shown in FIG. 12, the active layer 115, the gate insulating layer 113 and the light blocking line BL are formed under the data line DL. When the active layer 115 and the gate insulating layer 113 are disposed under the data line DL, the light blocking line BL blocks the light provided from the rear of the substrate 101 and traveling toward to the active layer 115.

However, when the active layer 115 and the gate insulating layer 113 are excluded under the data line DL as the first and second pad areas GPA and DPA, the light blocking line BL may also be excluded.

Figure 13:
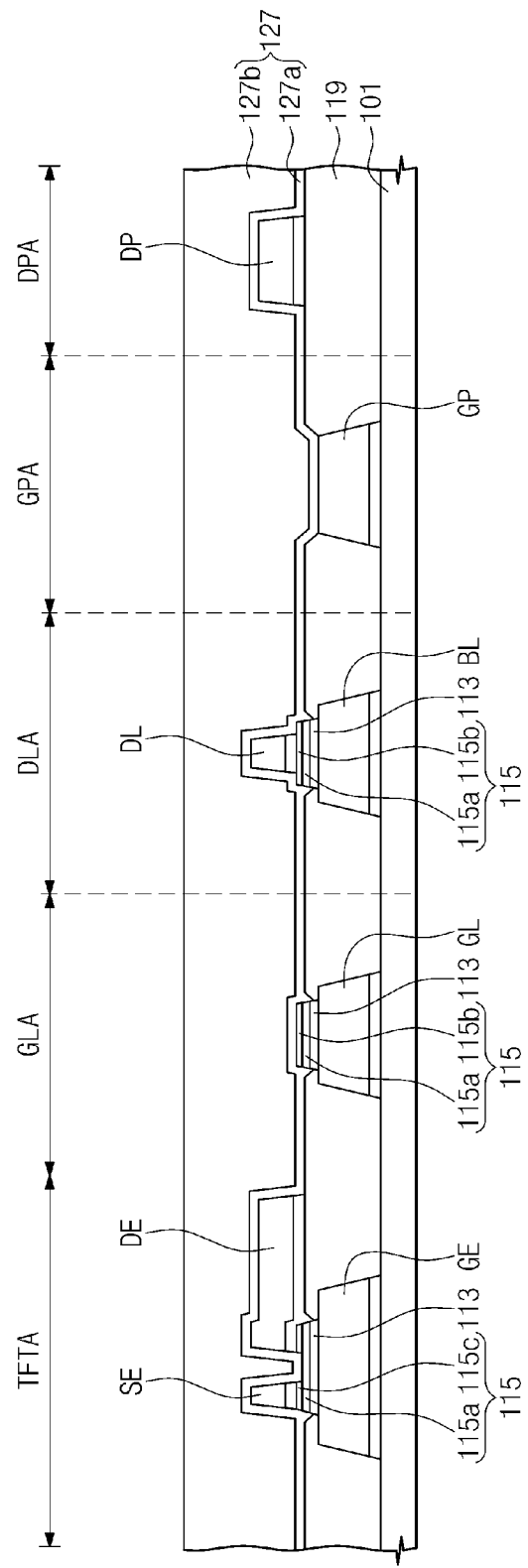

Then, as shown in FIG. 13, a protective layer 127 is formed on the planarization layer 119 to cover the source electrode SE, the drain electrode DE, the data line DL and the data pad DP. The protective layer 127 includes a protective inorganic layer 127a and a protective organic layer 127b, which are sequentially stacked. In the illustrated exemplary embodiment, the protective inorganic layer 127a includes silicon nitride or silicon oxide and has a cross-sectional thickness of about 1000 angstroms. The protective organic layer 127b includes acrylic-containing material such as a photosensitive resin.

Figure 14:
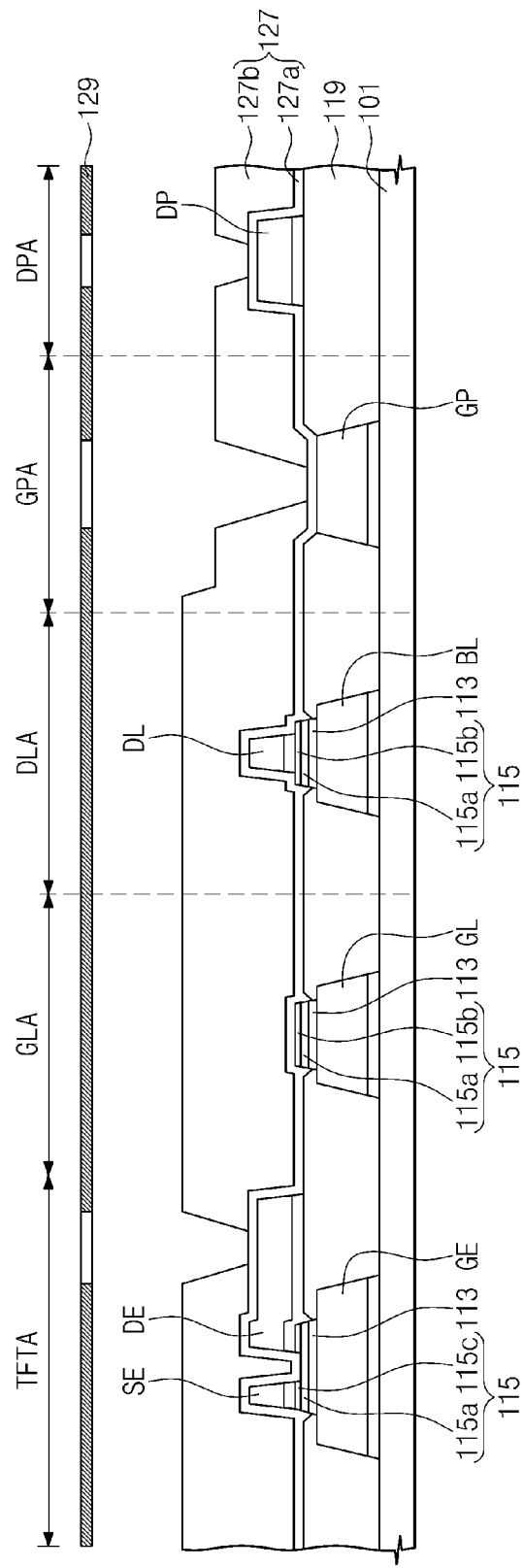

Referring to FIG. 14, when the protective organic layer 127b is exposed and developed after a third mask 129 is disposed on the protective organic layer 127b, portions of the protective organic layer 127b, which correspond to the drain electrode DE in the transistor area TFTA and the gate pad GP and the data pad DP respectively disposed in the first and second pad areas GPA and DPA, are partially removed.

Figure 15:
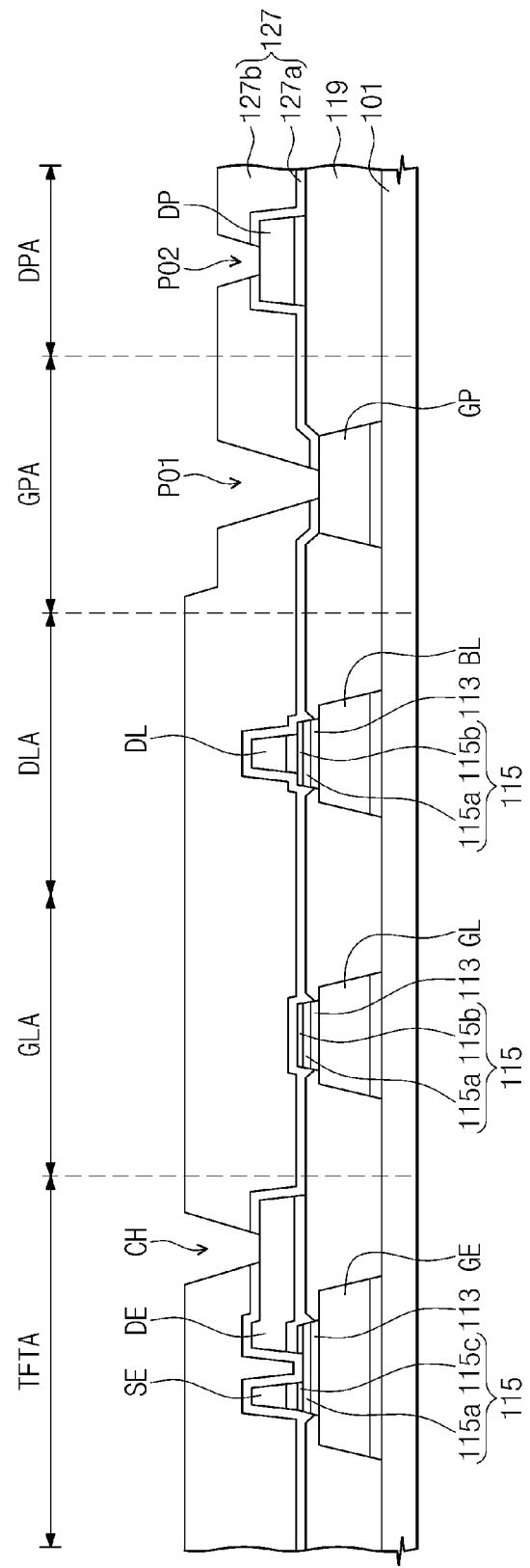

When the protective inorganic layer 127a is etched using the protective organic layer 127b as a mask, a contact hole CH, a first pad opening PO1 and a second pad opening PO2 are formed through the protective layer 127 to respectively expose the drain electrode DE, the gate pad GP and the data pad DP as shown in FIG. 15.

Figure 16:
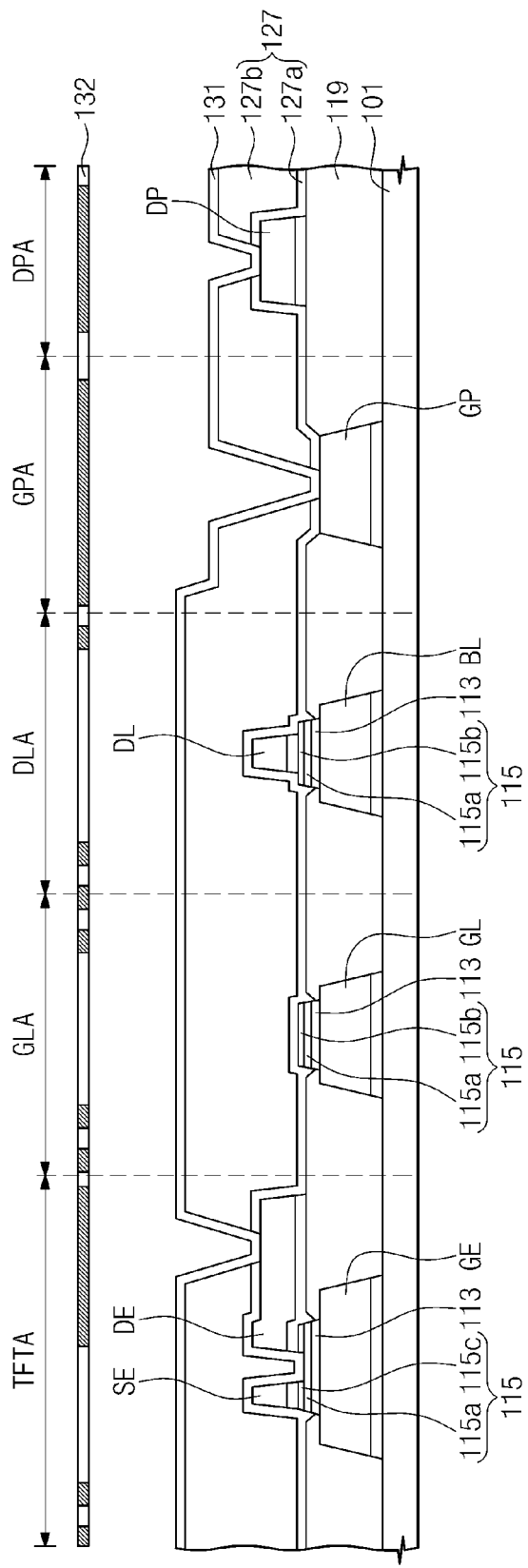

Referring to FIG. 16, a transparent electrode material layer 131 is formed on the protective layer 127. The transparent electrode material layer 131 may include a transparent conductive oxide ("TCO"), e.g., indium tin oxide ("ITO"), indium zinc oxide ("IZO"), etc.

Figure 17:
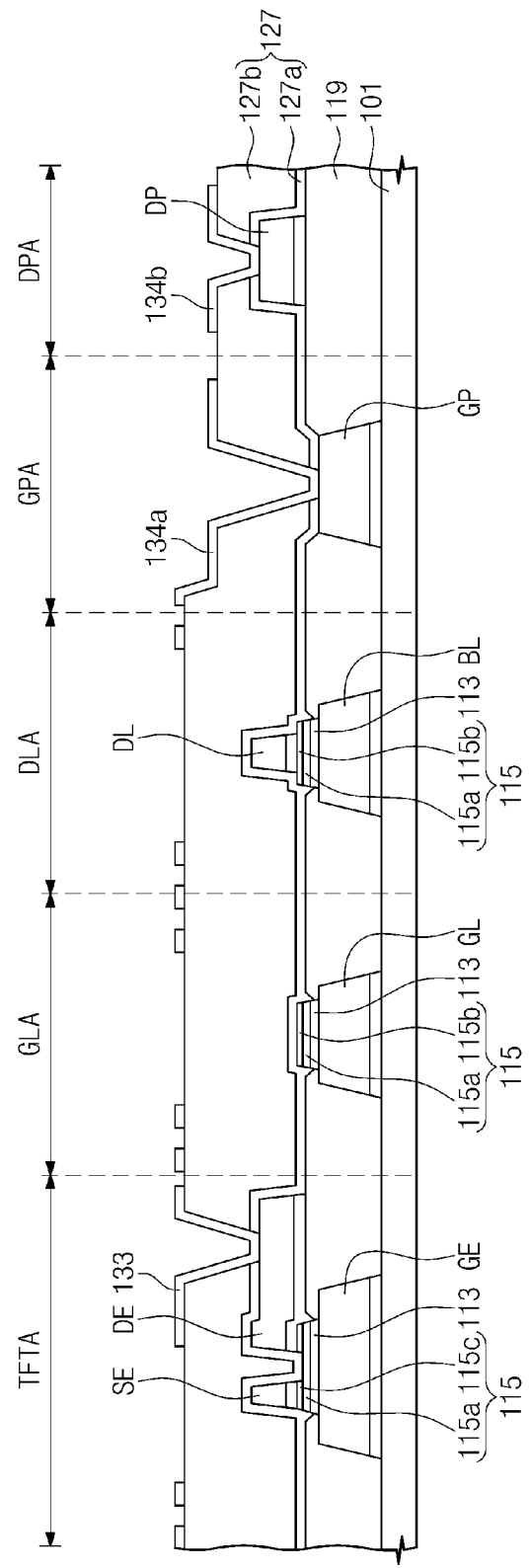

When the transparent electrode material layer 131 is patterned using a fourth mask 132, a pixel electrode 133 is formed to be electrically connected to the drain electrode DE through the contact hole CH as shown in FIG. 17. In addition, first and second pad electrodes 134a and 134b are respectively formed in the first and second pad areas GPA and DPA. The first pad electrode 134a makes contact with the gate pad GP through the first pad opening PO1 and the second pad electrode 134b makes contact with the data pad DP through the second pad opening PO2.

According to the above-described processes, the display panel is manufactured. For the convenience of explanation, only the manufacturing process of the thin film transistor substrate of the display panel has been shown in FIGS. 1 to 17. Although not shown in figures, the manufacturing process of the display panel may further include a process of coupling the thin film transistor substrate to an opposite substrate and a process of forming a display device, e.g., disposing a liquid crystal layer, between the thin film transistor substrate and the opposite substrate.

Hereinafter, a liquid crystal display panel configured to include the thin film transistor, the opposite substrate and the liquid crystal layer will be described in detail as the display panel.

Figure 18:
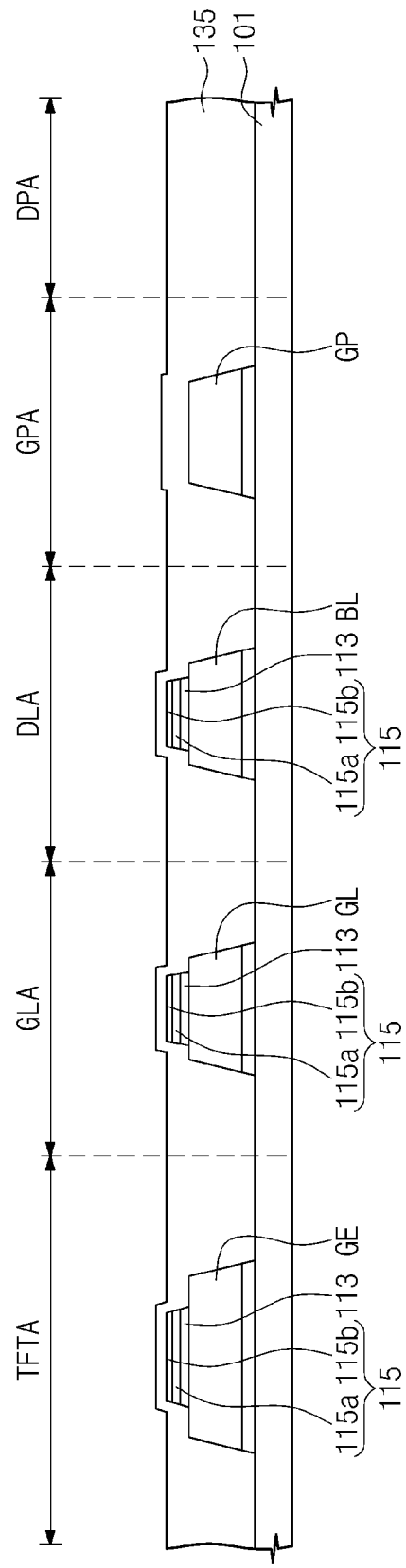
FIGS. 18 to 20 are cross-sectional views showing an exemplary embodiment of a process of forming a planarization layer according to the invention.
Figure 19:
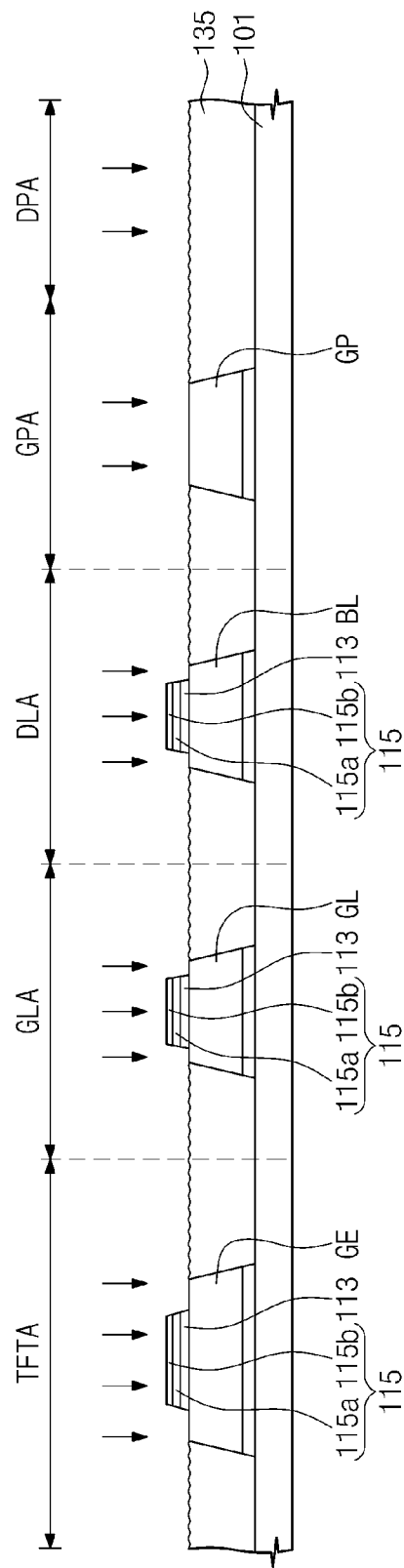
Figure 20:
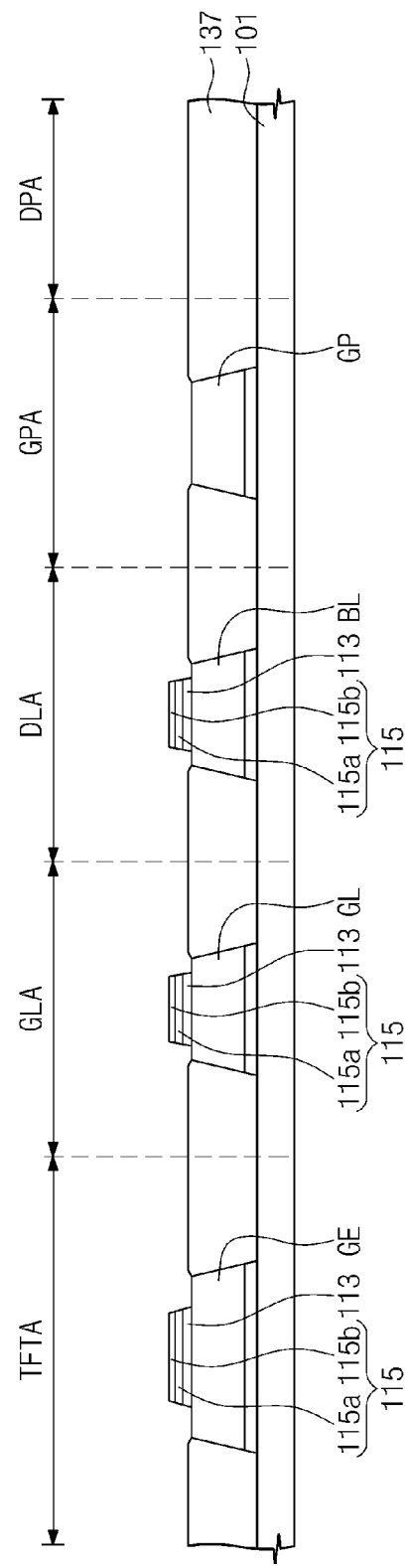

FIGS. 18 to 20 are cross-sectional views showing an exemplary embodiment of process of forming a planarization layer according to the invention.

Referring to FIG. 18, a planarization organic layer 135 is formed on the active layer 115 and the substrate 101 using an organic material. Processes performed before the planarization organic layer 135 is formed are the same as those shown in FIGS. 1 to 7, and thus details thereof will be omitted. In addition, the planarization organic layer 135 shown in FIG. 18 may not have photosensitivity.

Referring to FIG. 19, the planarization organic layer 135 is partially removed through an ashing process. The ashing process is performed until the planarization organic layer 135 is completely removed on the active layer 115, the gate electrode GE, the gate line GL, the light blocking line BL and the gate pad GP.

After the ashing process is performed, a surface roughness of the planarization organic layer 135 may be increased as illustrated by the wavy upper surface in FIG. 19. Accordingly, when a hard bake process is performed, a planarization layer 137 in which the surface roughness is decreased may be formed as shown in FIG. 20.

As shown in FIG. 18, a cross-sectional thickness of the planarization organic layer 135 on the gate pad GP is larger than a cross-sectional thickness of the planarization organic layer 135 on the active pattern 115. Therefore, a portion of the planarization organic layer 135 may remain on the gate pad GP after the ashing process is formed, but the invention is not limited thereto.

However, although a portion of the planarization organic layer 135 remains on the gate pad GP, such remaining portion of the planarization organic layer 135 may be removed by the process of forming the contact hole CH and the first and second pad openings PO1 and PO2 through the protective layer 127 shown in FIGS. 15 and 16. That is, when the protective inorganic layer 127a is etched using the protective organic layer 127b as the mask in order to form the first pad opening PO1, the portion of the planarization organic layer 135 remaining on the gate pad GP may be removed.

Figure 21:
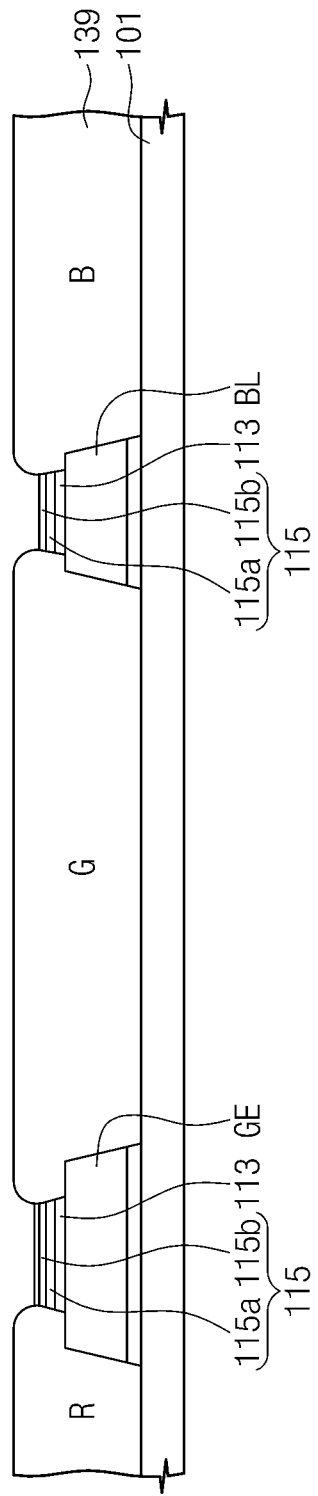
FIGS. 21 and 22 are cross-sectional views showing an exemplary embodiment of a planarization layer according to the invention.
Figure 22:
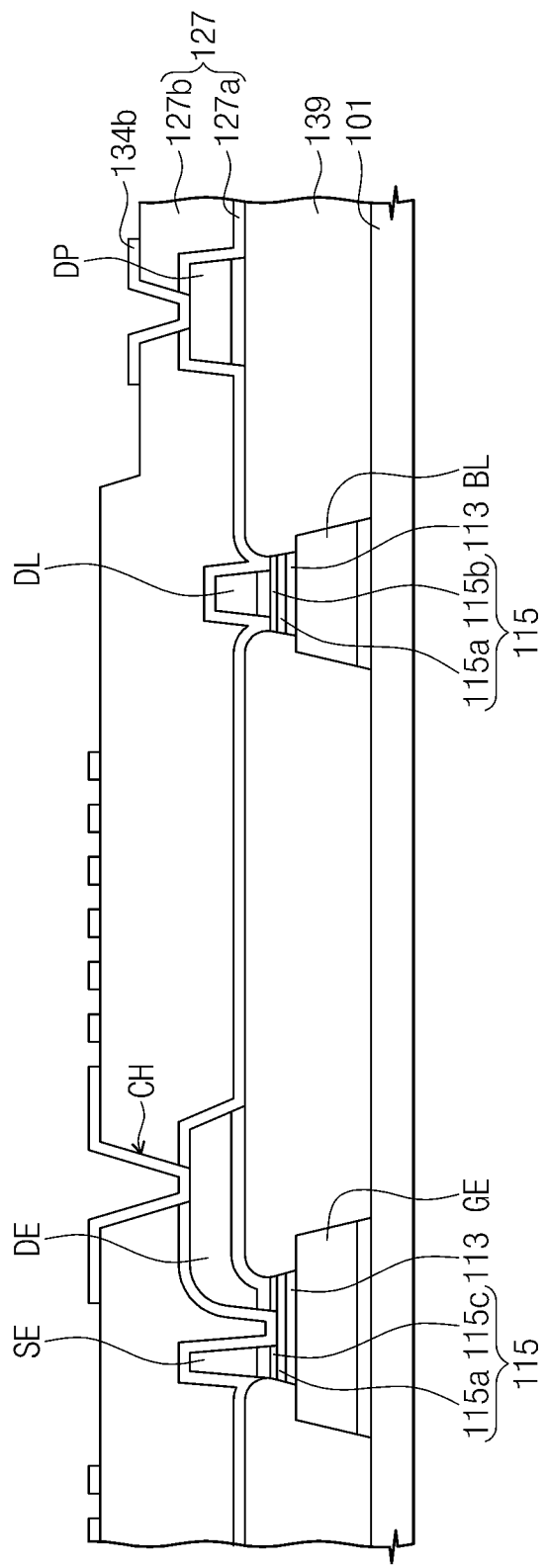

FIGS. 21 and 22 are cross-sectional views showing an exemplary embodiment of a planarization layer according to the invention.

Referring to FIG. 21, a planarization layer 139 includes red, green and blue color pixels R, G and B. Each of the red, green and blue color pixels R, G and B is formed in a corresponding pixel area of the display panel.

As shown in FIG. 22, processes performed after the planarization layer 139 is formed are the same as those shown in FIGS. 11 to 17, and thus details thereof will be omitted.

Figure 23:
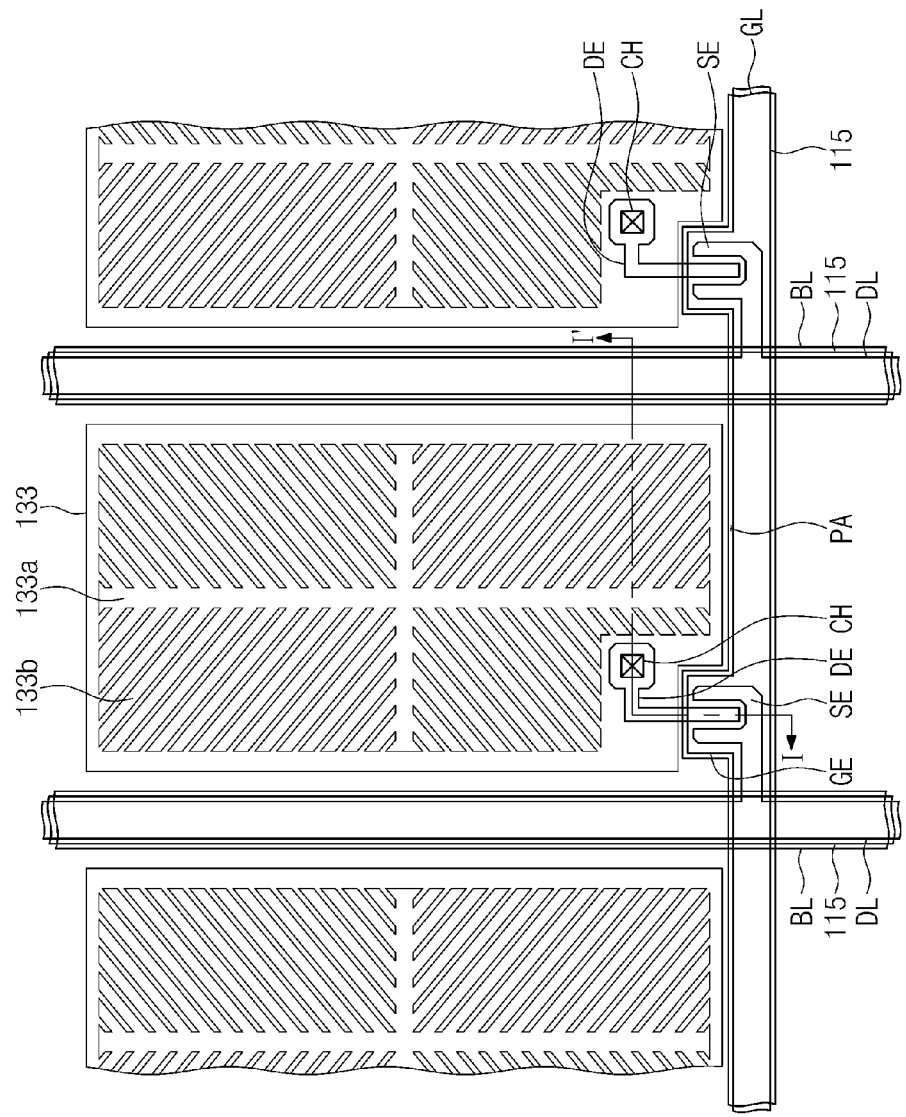
FIG. 23 is a plan view showing an exemplary embodiment of a display panel according to the invention.
Figure 24:
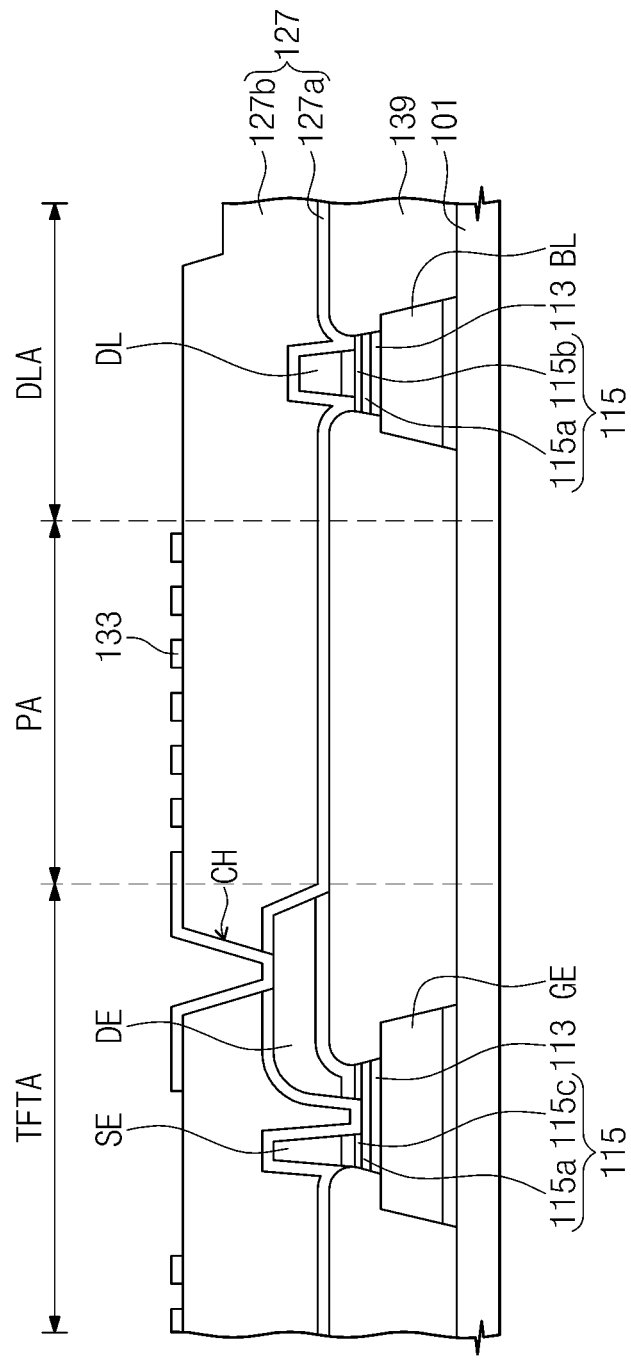
FIG. 24 is a cross-sectional view taken along line I-I' of FIG. 23.

FIG. 23 is a plan view showing an exemplary embodiment of a display panel according to the invention and FIG. 24 is a cross-sectional view taken along line I-I' of FIG. 23.

Referring to FIGS. 23 and 24, an exemplary embodiment of a pixel according to the invention includes the thin film transistor ("TFT") and the pixel electrode 133.

The substrate 101 includes the transistor area TFTA in which the thin film transistor is disposed, the first and second line areas GLA and DLA in which the gate line GL and the data line DL are respectively disposed, and a pixel area PA in which the pixel electrode 133 is disposed.

The gate line GL extends in a stripe shape along a first direction, and the data line DL extends along a second direction to cross the gate line GL. Here, the gate line GL extends to be substantially perpendicular to the data line DL, but the invention is not limited thereto. In addition, the gate line GL is electrically insulated from the data line DL by the gate insulating layer 113 and the active layer 115.

The thin film transistor is electrically connected to the data line DL and the gate line GL. In detail, the thin film transistor includes the gate electrode GE branched from the gate line GL, the source electrode SE branched from the data line DL, and the drain electrode DE disposed to be spaced apart from the source electrode SE and electrically connected to the pixel electrode 133. The thin film transistor may further include the gate insulating layer 113 and the active layer 115 with respect to the gate, source and drain electrodes GE, SE and DE. The pixel electrode 133 is electrically connected to the drain electrode DE through the contact hole CH in the transistor area TFTA.

The pixel electrode 133 includes a trunk portion 133a, and a plurality of branch portions 133b protruding from the trunk portion 133a and extending in a radial shape.

The trunk portion 133a may have a cross shape, and thus the pixel electrode 133 is divided into a plurality of domains by the trunk portion 133a. The branch portions 133b are disposed in each domain and extend in different directions according to the domains. In the illustrated exemplary embodiment, the pixel electrode 133 is divided in four domains as shown in FIG. 23, but the number of the domains should not be limited to four. The branch portions 133b are spaced apart from each other and extend to be substantially in parallel to each other in each domain. A distance between two adjacent branch portions 133b to each other is measured in terms of micrometers. The branch portions 133b are extended in an elongation direction, and the distance between adjacent branch portions 133b is taken perpendicular to the elongation direction. The branch portions 133b align liquid crystal molecules of the liquid crystal layer in a specific azimuth on a surface substantially in parallel to the substrate 101.

According to another exemplary embodiment, the pixel electrode 133 may include first and second sub-pixel electrodes applied with voltages having different levels, and each of the first and second sub-pixel electrodes may be divided into a plurality of domains. Where each of the first and second sub-pixel electrodes may be divided into a plurality of domains, the liquid crystal molecules are aligned in different directions according to the domains and an alignment angle of the liquid crystal molecules are changed, and thus a viewing angle of the liquid crystal display panel may be improved.

Referring to FIG. 24, the gate insulating layer 113 is not formed in (e.g., excluded from) each pixel area PA. That is, since the gate insulating layer 113 and the active layer 115 are substantially simultaneously patterned, the gate insulating layer 113 is disposed on the patterns formed by patterning the metal material layer 103, e.g., the gate electrode GE, the gate line GL, the light blocking line BL, etc., in the transistor area TFTA and the first and second line areas GLA and DLA.

When the gate insulating layer 113 is excluded in the pixel area PA, a transmittance of the liquid crystal display panel may be improved compared with a conventional liquid crystal display panel in which the gate insulating layer 113 is disposed in the pixel area PA.

In addition, edges of the gate insulating layer 113 and the active layer 115 are disposed more inward than edges of the gate electrode GE and the gate line GL.

FIGS. 25 to 29 are cross-sectional views showing another exemplary embodiment of a method of manufacturing a display panel according to the invention. In FIGS. 25 to 29, the same reference numerals denote the same elements in FIGS. 1 to 17, and thus detailed descriptions of the same elements will be omitted.

Figure 25:
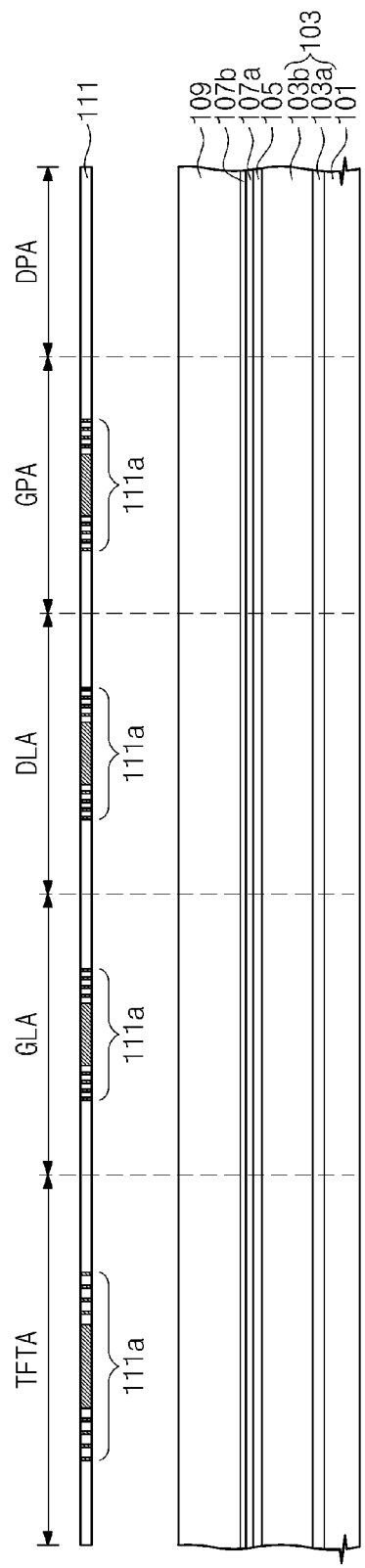
FIGS. 25 to 29 are cross-sectional views showing another exemplary embodiment of a method of manufacturing a display panel according to the invention.

Referring to FIG. 25, a first metal material layer 103 is formed on the substrate 101 and the first metal material layer 103 includes a first lower metal layer 103a and a first upper metal layer 103b, which are sequentially stacked. A first insulating layer 105, an amorphous silicon layer 107a, an n+ amorphous silicon layer 107b, and a first photoresist layer 109 are sequentially stacked on the first upper metal layer 103b.

A first mask 111 is disposed on the first photoresist layer 109. The first mask 111 has a halftone pattern 111a in a transistor area TFTA, first and second line areas GLA and DLA, and a first pad area GPA.

Figure 26:
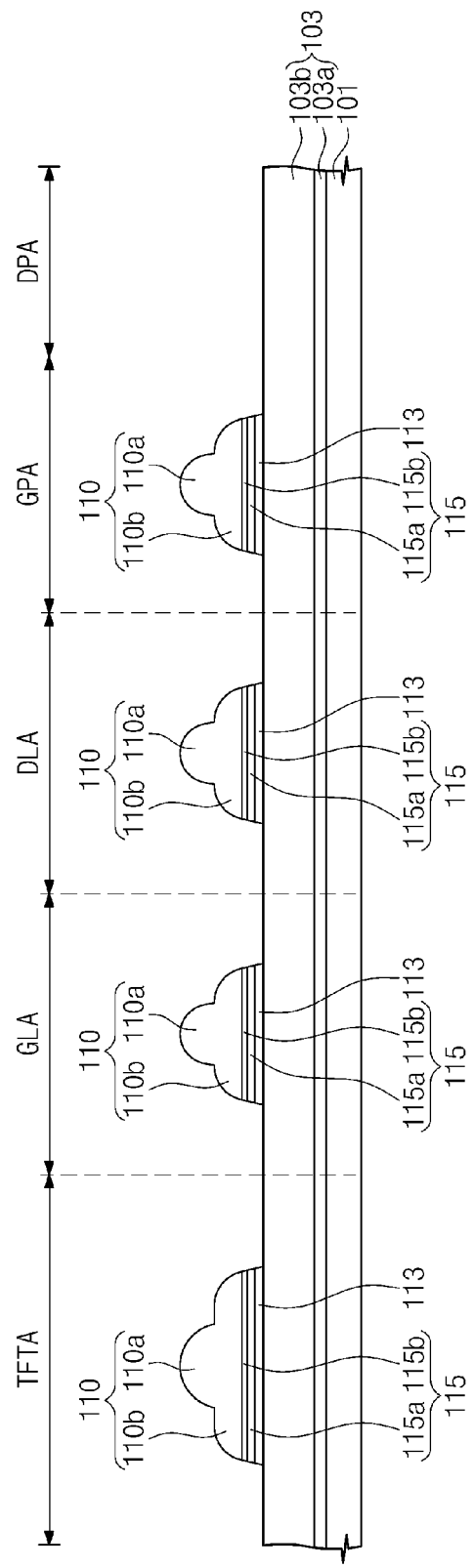

When the first photoresist layer 109 is exposed and developed using the first mask 111 as a mask and the exposed first photoresist layer 109 is removed, a first photoresist pattern 110 is formed on the n+ amorphous silicon layer 107b as shown in FIG. 26.

Referring to FIG. 26, the first photoresist pattern 110 includes a first part 110a corresponding to a center portion of the transistor area TFTA, the first and second line areas GLA and DLA, and the first pad area GPA, and a second part 110b formed along an end portion of the transistor area TFTA, the first and second line areas GLA and DLA, and the first pad area GPA.

The first part 110a of the first photoresist pattern 110 has a first cross-sectional thickness t1 and the second part 110b of the first photoresist pattern 110 has a second cross-sectional thickness t2 smaller than the first thickness t1.

The first photoresist pattern 110 is completely removed in the second pad area DPA.

Then, the first insulating layer 105, the amorphous silicon layer 107a and the n+ amorphous silicon layer 107b are dry-etched using the first photoresist pattern 110 as a mask, and thus the first insulating layer 105, the amorphous silicon layer 107a and the n+ amorphous silicon layer 107b are removed except for the area in which the first photoresist pattern 110 is formed.

Figure 27:
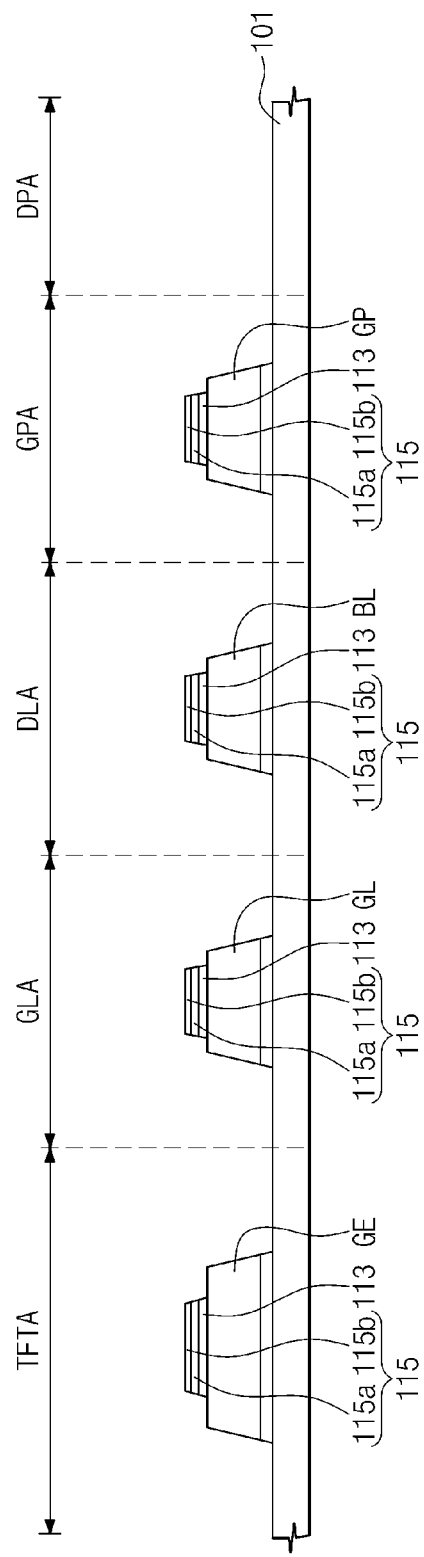

When the processes similar to those shown in FIGS. 4 to 6 are performed, a gate electrode GE is formed in the transistor area TFTA, a gate line GL is formed in the first line area GLA, and a light blocking line BL is formed in the second line area DLA as shown in FIG. 27. In addition, a gate pad GP is formed in the first pad area GPA. Different from FIG. 7, the gate insulating layer 113 and the active layer 115 remain on the gate pad GP shown in FIG. 27.

Figure 28:
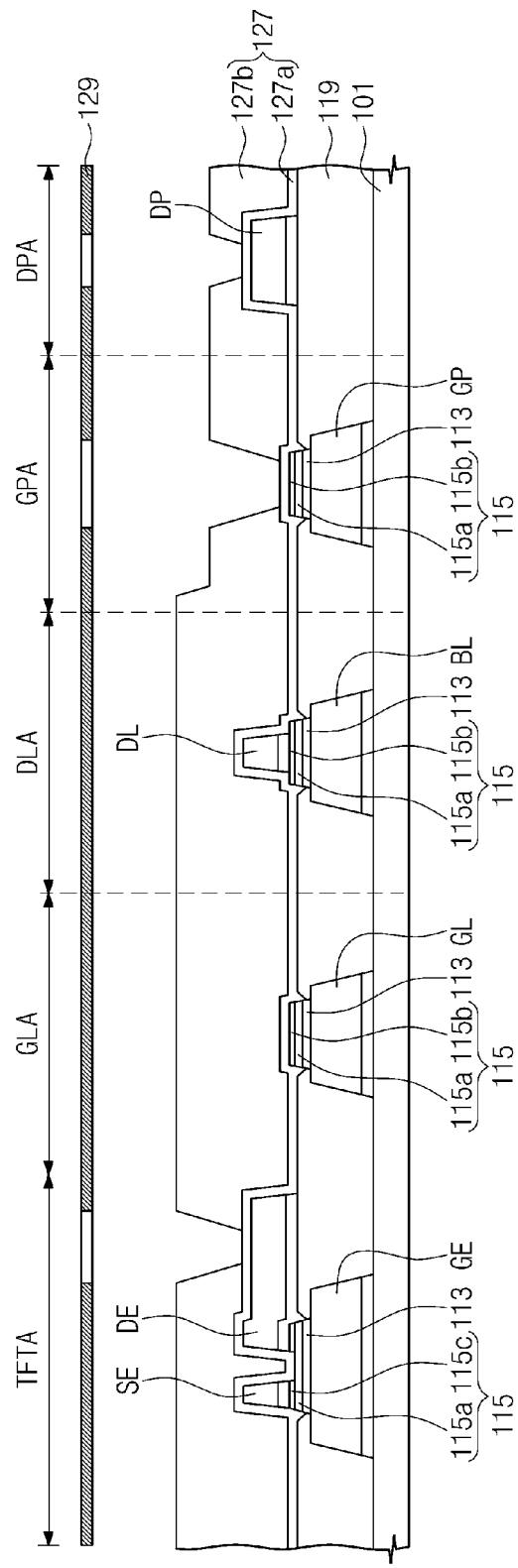
Figure 29:
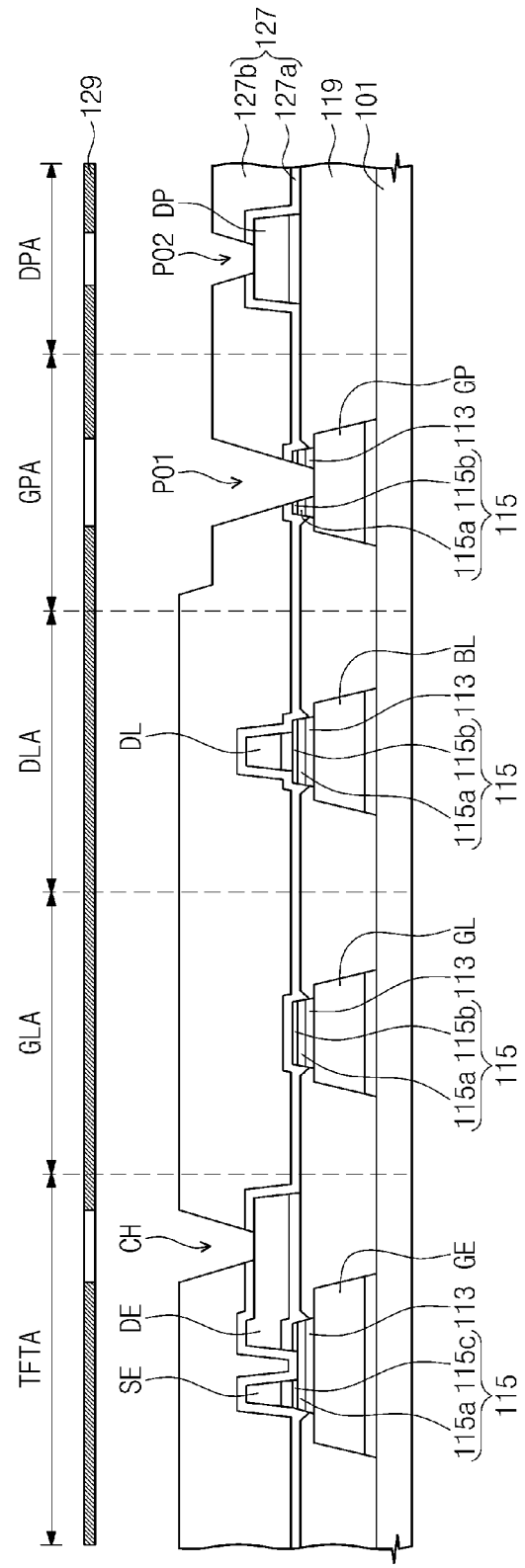

When the processes similar to those shown in FIGS. 8 to 13, a contact pattern and first and second opening patterns may be formed through a protective organic layer 127b using a third mask 129 as shown in FIG. 28.

When the protective inorganic layer 127a is etched using the protective organic layer 127b, a contact hole CH is formed in the transistor area TFTA and first and second pad openings PO1 and PO2 are respectively formed in the first and second pad areas GPA and DPA.

When the first pad opening PO1 is formed, the gate insulating layer 113 and the active layer 115, which remain on the gate pad GP, may be removed. Thus, the upper surface of the gate pad GP is exposed through the first pad opening PO1.

Then, the thin film transistor substrate is manufactured by performing the processes similar to those shown in FIGS. 16 and 17.

Although exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A method of manufacturing a display panel comprising:
   sequentially stacking a first metal layer, a first insulating layer, an amorphous silicon layer, an n+ amorphous silicon layer, and a first photoresist layer, on a substrate comprising a transistor area and a line area;
   patterning the first photoresist layer using a first mask comprising a halftone pattern in the transistor area and the line area, to form a first photoresist pattern;
   substantially simultaneously removing portions of the stack of the amorphous silicon layer, the n+ amorphous silicon layer, the first insulating layer and the first metal layers, by exposing the portions through the first photoresist pattern, to form an active layer and a gate insulating layer each defining a protruding portion thereof which extends further than the gate electrode and the gate line and to form a gate electrode extended from a gate line;
   removing the protruding portion of the active layer and the gate insulating layer, to form respective edges of the gate electrode and the gate line protruding further than edges of the active layer and the gate insulating layer on the gate electrode and the gate line;
   forming a planarization organic layer comprising an organic material, on the active layer and the substrate, after the active layer is formed;
   removing the planarization organic layer overlapping the active layer, to form a planarization layer;
   forming a second metal layer on the planarization layer and the active layer;
   patterning the second metal layer using a second mask to form a source electrode, a drain electrode and a data line;
   forming a protective layer on the planarization layer to cover the source electrode, the drain electrode and the data line;
   patterning the protective layer using at least a third mask, a contact hole being formed through the protective layer to expose the drain electrode;
   forming a transparent electrode layer on the protective layer; and
   patterning the transparent electrode layer using a fourth mask to form a pixel electrode electrically connected to the drain electrode through the contact hole.

2. The method of claim 1, wherein the first photoresist pattern comprises:
   a first part corresponding to a center portion of the transistor area and the line area, and having a first cross-sectional thickness; and
   a second part being corresponding to an edge of the transistor area and the line area, and having a second cross-sectional thickness smaller than the first cross-sectional thickness.

3. The method of claim 2, further comprising
   etching back the first photoresist pattern to remove the second part, wherein the first part remains and exposes the protruding portion of the active layer and the gate insulating layer which extends further than the gate electrode and the gate line;
   removing the protruding portion of the active layer and the gate insulating layer using the remaining first part of the first photoresist pattern as a mask; and
   removing the remaining first part of the first photoresist pattern.

4. The method of claim 3, wherein
   the substrate further comprises a pad area in which a gate pad is formed,
   the first mask comprises a slit pattern corresponding to the pad area in which the gate pad is formed, and
   the first photoresist pattern has the second thickness in the pad area.

5. The method of claim 4, wherein
   the first photoresist pattern is removed in the pad area, when the first photoresist pattern is etched back, and
   the active layer and the gate insulating layer are removed in the pad area to expose the gate pad, when the protruding portion is removed.

6. The method of claim 3, wherein
   the substrate further comprises a pad area in which a gate pad is formed,
   the first photoresist pattern has the first thickness in the pad area,
   the active layer and the gate insulating layer are formed in the pad area, when the stacked layers are patterned using the first photoresist pattern as a mask, and
   the active layer and the gate insulating layer in the pad area are removed to expose the gate pad, when the protective layer is patterned.

7. The method of claim 1, wherein the forming the planarization layer comprises:
   performing a rear surface exposing process on the planarization organic layer;
   developing the exposed planarization organic layer to remove the planarization organic layer overlapping the active layer; and
   curing the developed planarization organic layer.

8. The method of claim 1, wherein the forming the planarization layer comprises:
   ashing the planarization organic layer to remove the planarization organic layer overlapping the active layer; and
   hard baking the ashed planarization organic layer.

9. The method of claim 1, wherein the protective layer formed on the planarization layer comprises:
   a protective inorganic layer on the planarization layer; and
   a photosensitive protective organic layer on the protective inorganic layer.

10. The method of claim 9, wherein the forming the contact hole through the protective layer comprising the protective inorganic layer and the photosensitive protective organic layer comprises:
    exposing and developing the photosensitive protective organic layer using the third mask to form a contact hole pattern through the protective organic layer; and
    etching the protective inorganic layer using the protective organic layer as a mask, to form the contact hole through the protective layer.

11. The method of claim 1, wherein the planarization organic layer comprises red, green and blue color pixels.

12. The method of claim 1, wherein the gate insulating layer and the active layer overlap the gate line.

13. The method of claim 1, wherein the forming the active layer, the gate insulating layer and the gate electrode extended from the gate line comprises forming a light blocking line in the line area.

14. The method of claim 13, wherein
    the light blocking line extends along the data line, and
    the gate insulating layer and the active layer are between the light blocking line and the data line.

15. The method of claim 1, wherein the forming the source electrode, the drain electrode and the data line comprises:
- forming a second photoresist layer on the second metal layer;
- patterning the second photoresist layer using the second mask to form a second photoresist pattern;
- etching the second metal layer using the second photoresist pattern to form the source electrode, the drain electrode and the data line; and
- partially removing the active layer between the source electrode and the drain electrode to form a channel layer of a thin film transistor.

16. A display panel comprising:
- a gate electrode and a gate line on a substrate;
- a gate insulating layer and an active layer sequentially on the gate electrode and the gate line;
- a planarization layer which is on the substrate and compensates a step difference between the substrate, and the gate electrode and the gate line, respectively,
- wherein respective edges of the gate electrode and the gate line protrude further than edges of the gate insulating layer and the active layer on the gate electrode and the gate line;
- source and drain electrodes on the active layer overlapping the gate electrode, and spaced apart from each other;
- a data line on the active layer and crossing the gate line;
- a protective layer which covers the planarization layer, the source and drain electrodes, and the data line, and a contact hole defined in the protective layer and partially exposing the drain electrode; and
- a pixel electrode on the protective layer and electrically connected to the drain electrode through the contact hole.

17. The display panel of claim 16, wherein
the substrate comprises a pixel area, and
the gate insulating layer overlaps the gate electrode and the gate line, and is excluded from the pixel area.

18. The display panel of claim 16, further comprising a light blocking line under and extended along the data line,
wherein the gate insulating layer and the active layer are between the light blocking line and the data line.

* * * * *